US012501544B2

(12) United States Patent
Momose

(10) Patent No.: US 12,501,544 B2
(45) Date of Patent: Dec. 16, 2025

(54) WIRING SUBSTRATE

(71) Applicant: SHINKO ELECTRIC INDUSTRIES CO., LTD., Nagano-ken (JP)

(72) Inventor: Shuhei Momose, Nagano (JP)

(73) Assignee: SHINKO ELECTRIC INDUSTRIES CO., LTD, Nagano-Ken (JP)

( * ) Notice: Subject to any disclaimer, the term of this patent is extended or adjusted under 35 U.S.C. 154(b) by 122 days.

(21) Appl. No.: 18/340,097

(22) Filed: Jun. 23, 2023

(65) Prior Publication Data

US 2024/0015883 A1 Jan. 11, 2024

(30) Foreign Application Priority Data

Jul. 7, 2022 (JP) ................................ 2022-109506

(51) Int. Cl.

*H05K 1/02* (2006.01)
*H01L 23/00* (2006.01)
*H01L 23/498* (2006.01)

(52) U.S. Cl.

CPC ..... *H05K 1/0296* (2013.01); *H01L 23/49822* (2013.01); *H01L 23/49866* (2013.01); *H01L 24/81* (2013.01); *H01L 24/05* (2013.01); *H01L 24/13* (2013.01); *H01L 24/16* (2013.01); *H01L 24/32* (2013.01); *H01L 24/73* (2013.01); *H01L 2224/05644* (2013.01); *H01L 2224/05647* (2013.01); *H01L 2224/13111* (2013.01); *H01L 2224/13113* (2013.01); *H01L 2224/13139* (2013.01); *H01L 2224/13147* (2013.01);

(Continued)

(58) Field of Classification Search

CPC ............... H01L 21/4857; H01L 21/486; H01L 21/4871; H01L 23/49822; H01L 23/49827; H01L 24/81; H01L 2224/05644; H01L 2224/32225; H01L 2224/81444; H05K 1/0296; H05K 2201/0367; H05K 2201/10674; H05K 3/244; H05K 3/3436; H05K 3/4007

USPC .......................................................... 174/251

See application file for complete search history.

(56) References Cited

U.S. PATENT DOCUMENTS

2008/0264681 A1 10/2008 Iwai et al.
2009/0285980 A1 11/2009 Iwai et al.

(Continued)

FOREIGN PATENT DOCUMENTS

JP 2006179797 A 7/2006

*Primary Examiner* — Timothy J Thompson
*Assistant Examiner* — Sidi M Maiga
(74) *Attorney, Agent, or Firm* — Tarolli, Sundheim, Covell & Tummino LLP

(57) ABSTRACT

A wiring substrate includes a wiring layer, a protective insulation layer covering the wiring layer, an opening extending through the protective insulation layer and partially exposing an upper surface of the wiring layer, a first plating layer formed inside the opening on the wiring layer that is exposed in the opening, a gap extending between a side surface of the first plating layer and a wall surface of the opening, and a second plating layer entirely covering a surface of the first plating layer in the opening of the protective insulation layer. The first plating layer is formed from nickel or a nickel alloy. The second plating layer is formed from a metal having a higher resistance to oxidation than the metal forming the first plating layer. The second plating layer entirely covers a side surface of the first plating layer that is exposed in the gap.

6 Claims, 12 Drawing Sheets

10 31 40 41 42 43 P1 32 30 S1 53 52 41 51 42 43 21 20 11

(52) U.S. Cl.
CPC ............... *H01L 2224/16227* (2013.01); *H01L 2224/32225* (2013.01); *H01L 2224/73204* (2013.01); *H01L 2224/81444* (2013.01)

(56) References Cited

U.S. PATENT DOCUMENTS

| | | | | |
|---|---|---|---|---|
| 2014/0069694 | A1* | 3/2014 | Cho | H05K 3/3452<br>174/251 |
| 2014/0138134 | A1* | 5/2014 | Imafuji | H05K 3/4007<br>174/257 |
| 2017/0179012 | A1* | 6/2017 | Shimodaira | H01L 24/08 |
| 2023/0115650 | A1* | 4/2023 | Iyoda | H05K 1/112<br>174/261 |

* cited by examiner 10
30
11
31
20
21
40
P1
41
42
43
S1
51
52
53
60
61
P2
70
71
80
S2

10
30
20
11
32
S1
42
43
53
P1
21
40
43
42
41
31
52
51
41

90
10
91
95
92
93
40
41
42
43
P1
31
20
21
30
11
70
53
S1
51
52
60
61
P2
80
71
S2

10
30
32
S1
42
43
53
20
11
P1
21
40
43
42
41
31
52
51
41

10
30
32
S1
42
43
55
56
53
20
11
P1
21
40
43
42
41
31
55
52
51
41

10
30
20
11
32
S1
42
43
53
P1
40
43
42
41
31
52

WIRING SUBSTRATE

CROSS-REFERENCE TO RELATED APPLICATIONS

This application is based upon and claims the benefit of priority from prior Japanese Patent Application No. 2022-109506, filed on Jul. 7, 2022, the entire contents of which are incorporated herein by reference.

FIELD

This disclosure relates to a wiring substrate and a method for manufacturing a wiring substrate.

BACKGROUND

Wiring substrates for mounting electronic components, such as semiconductor elements, are available in various shapes and structures. A wiring substrate includes a wiring layer, on a base substrate, and a solder resist layer covering the wiring layer. The wiring layer includes a connection pad exposed from the solder resist layer at a bottom of an opening extending through the solder resist layer in the thickness direction. Japanese Laid-Open Patent Publication No. 2006-179797 describes an example of such a wiring substrate. In such type of wiring substrate, an exterior plating layer is formed in the opening of the solder resist layer on the exposed wiring layer. The exterior plating layer is a stack of a nickel (Ni) layer, a palladium (Pd) layer, and a gold (Au) layer.

SUMMARY

The Ni layer may be formed through an electroless plating process. In this case, the Ni layer will not form on the solder resist layer. Thus, a slight gap will be produced between the side surface of the Ni layer and the wall surface of the opening in the solder resist layer. The plating solution that enters the slight gap to form the Pd layer and the Au layer may be limited. Thus, the Pd layer and the Au layer may not form on the side surface of the Ni layer. In this case, the Ni layer will be exposed in the gap. Under such a situation, if cleaning water enters the gap in a subsequent process, a local cell effect caused by a difference in ionization tendency between Au and Ni will elute Ni from the Ni layer into the cleaning water. Contamination of the cleaning water with Ni will result in Ni collecting on the surface of the Au layer. The collected Ni may discolor the surface of the Au layer.

In one general aspect, a wiring substrate includes a wiring layer, a protective insulation layer covering the wiring layer, an opening extending through the protective insulation layer in a thickness direction and partially exposing an upper surface of the wiring layer, a first plating layer located inside the opening and formed on the wiring layer that is exposed in the opening, a gap extending between a side surface of the first plating layer and a wall surface of the opening, and a second plating layer entirely covering a surface of the first plating layer in the opening of the protective insulation layer. The first plating layer is formed from nickel or a nickel alloy. The second plating layer is formed from a metal having a higher resistance to oxidation than the metal forming the first plating layer. The second plating layer entirely covers a side surface of the first plating layer that is exposed in the gap.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
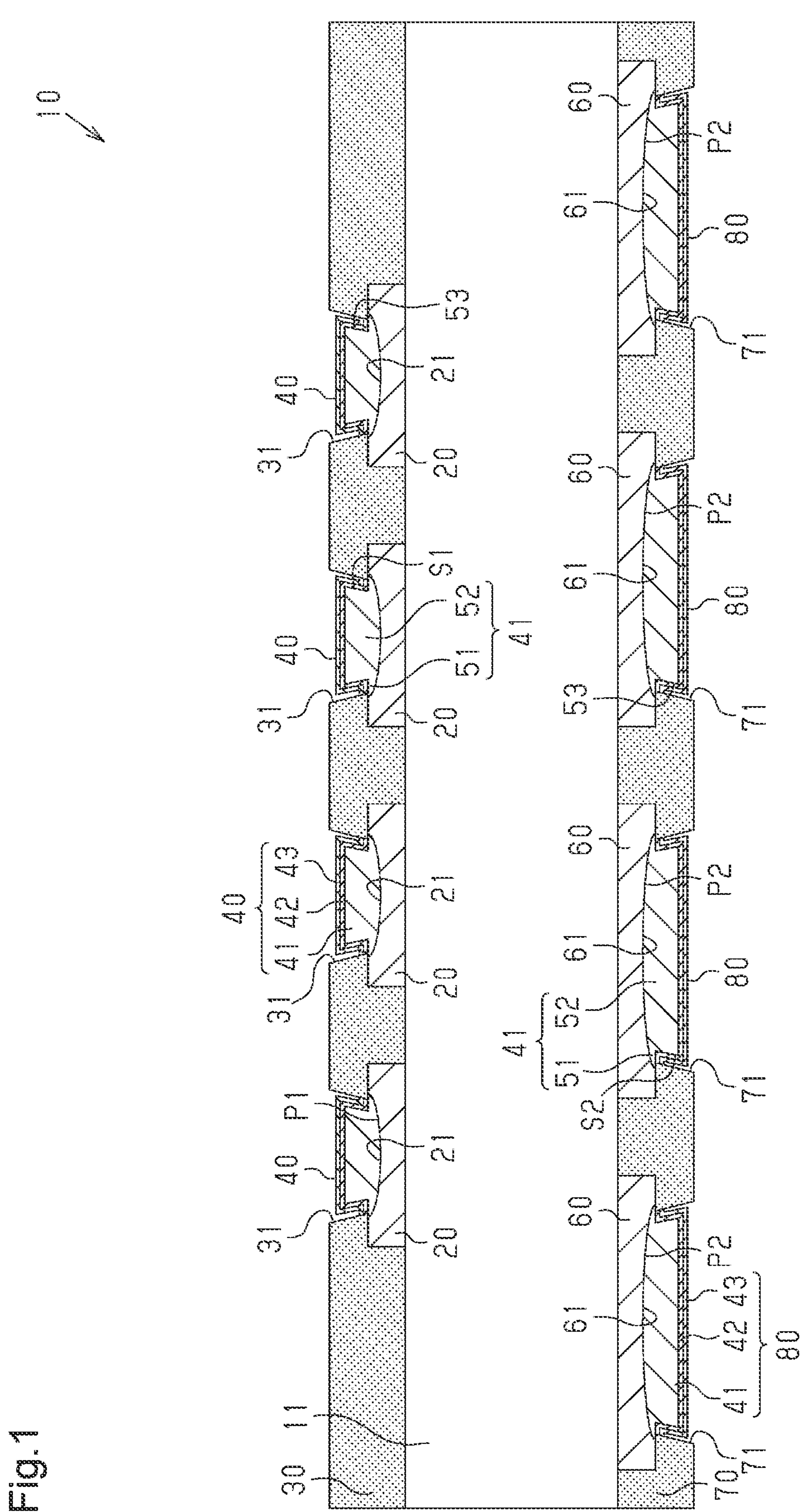
FIG. 1 is a schematic cross-sectional view illustrating one embodiment of a wiring substrate.

One embodiment will now be described with reference to the drawings.

In the accompanying drawings, elements are illustrated for simplicity and clarity and have not necessarily been drawn to scale. To facilitate understanding, hatching lines may not be illustrated or may be replaced by shadings in the cross-sectional views. In this specification, a plan view refers to a view taken in a vertical direction (e.g., vertical direction as viewed in FIG. 1), and a planar shape refers to a shape of a subject as viewed in the vertical direction. Further, in this specification, upward, downward, leftward, and rightward directions refer to directions that allow for the reference characters denoting members to be read properly. Also, in this specification, the terms of parallel, perpendicular, and orthogonal are not meant to be strictly parallel, perpendicular, and orthogonal and include generally parallel, perpendicular, and orthogonal states allowing the advantages of the embodiments to be obtained. In this specification, "equal" will not only cover a state in which the compared subjects are exactly equal but also cover a state in which there is a slight difference, resulting from dimensional tolerances or the like, between the compared subjects.

Entire Structure of Wiring Substrate 10

Figure 2:
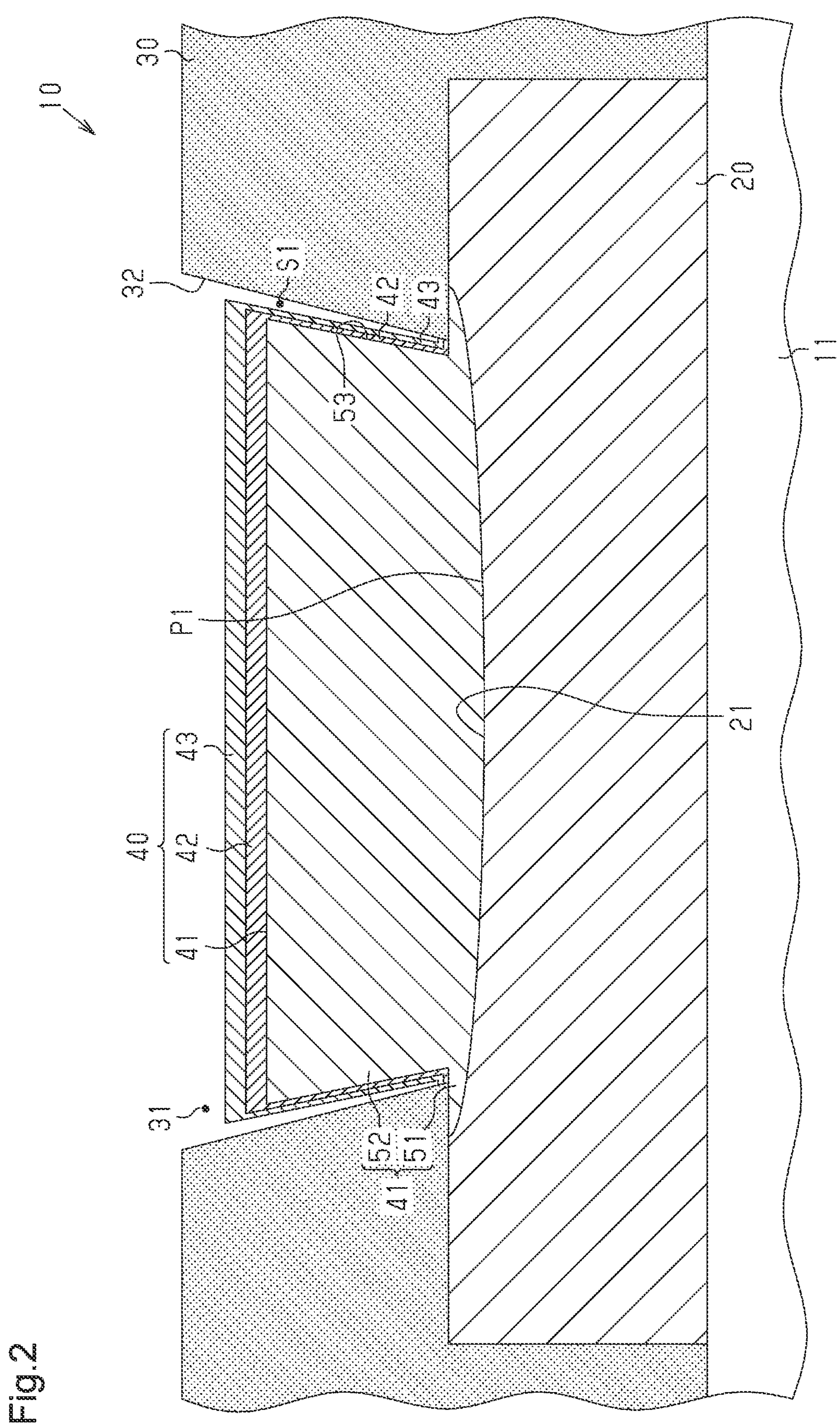
FIG. 2 is a partially enlarged cross-sectional view of the wiring substrate illustrated in FIG. 1.

With reference to FIGS. 1 and 2, the structure of a wiring substrate 10 will now be described.

As illustrated in FIG. 1, the wiring substrate 10 includes, for example, a substrate body 11. The wiring substrate 10 includes a stack of a wiring layer 20 and a solder resist layer 30 formed in order on, for example, the upper surface of the substrate body 11. The wiring substrate 10 includes an external plating layer 40 formed on the upper surface of the wiring layer 20 and exposed from the solder resist layer 30. Further, the wiring substrate 10 includes a stack of a wiring layer 60 and a solder resist layer 70 formed in order on, for example, the lower surface of the substrate body 11. The wiring substrate 10 includes an external plating layer 80 formed on the lower surface of the wiring layer 60 and exposed from the solder resist layer 70.

A wiring structure of alternately stacked insulative resin layers and wiring layers may be used as the main substrate body 11. The wiring structure may include, for example, a core substrate but does not have to. The material of the insulative resin layers may be, for example, an insulative thermosetting resin. The insulative thermosetting resin may be, for example, an insulative resin such as an epoxy resin, a polyimide resin, or a cyanate resin. The material of the insulative resin layers may also be, for example, an insulative resin of which the main component is a photosensitive resin such as a phenolic resin or a polyimide resin. The insulative resin layers may include, for example, a filler of silica or alumina.

The material of the wiring layers for the substrate body 11 and the wiring layers 20 and 60 may be, for example, copper (Cu) or a copper alloy. The material of the solder resist layers 30 and 70 may be, for example, an insulative resin of which the main component is a photosensitive resin such as a phenolic resin or a polyimide resin. The solder resist layers 30 and 70 may include, for example, a filler of silica or alumina.

Structure of Wiring Layer 20

The wiring layer 20 is formed on the upper surface of the substrate body 11. The wiring layer 20 is the uppermost wiring layer of the wiring substrate 10. The wiring layer 20 may have any shape and size in plan view. For example, the wiring layer 20 has a circular shape in plan view. The wiring layer 20 includes recesses 21 formed in the upper surface of the wiring layer 20. Each recess 21 is inwardly curved toward the substrate body 11. The recess 21 may have any shape and size in plan view. For example, the recess 21 has a circular shape in plan view.

Structure of Solder Resist Layer 30

The solder resist layer 30 is formed on the upper surface of the substrate body 11 and covers the wiring layer 20. The solder resist layer 30 is the outermost insulation layer (uppermost insulation layer) of the wiring substrate 10. The solder resist layer 30 has a thickness from the upper surface of the wiring layer 20 to the upper surface of the solder resist layer 30 that is, for example, approximately 10 m to 30 m.

The solder resist layer 30 includes openings 31 that extend through the solder resist layer 30 in the thickness direction and expose parts of the upper surface of the wiring layer 20 as connection pads P1. Each connection pad P1 functions as, for example, an electronic component mounting pad for electrically connecting an electronic component such as a semiconductor element 91 (refer to FIG. 3).

The openings 31 are respectively in connection with, for example, the recesses 21 of the wiring layer 20. In each opening 31, for example, the surface of the corresponding recess 21 is exposed. The opening 31 may have any shape and size in plan view. The opening 31 is, for example, shaped in correspondence with the recess 21 in plan view. For example, the opening 31 has a circular shape in plan view. The opening 31 may have a depth of, for example, approximately 10 m to 30 m.

As illustrated in FIG. 2, for example, the opening 31 is tapered so that the opening width (opening diameter) decreases from the upper side as viewed in FIG. 2 (upper surface of solder resist layer 30) toward the lower side (wiring layer 20). The opening 31 has a wall surface 32 inclined toward the inner side of the opening 31 (i.e., center of opening 31) from, for example, the upper end of the opening 31 toward the lower end of the opening 31. The wall surface 32 does not have to be straight and may be partially or entirely curved inwardly or outwardly. In the example of FIG. 2, the wall surface 32 is an inclined surface extending straight without any stepped parts in cross section. Thus, the wall surface 32 is inclined at a constant angle.

The wall surface 32 has a lower end, for example, projecting toward the inner side of the recess 21 of the wiring layer 20 in plan view. The lower end of the wall surface 32 is located, for example, above the recess 21. The lower end of the wall surface 32 is located at a position overlapping the circumferential portion of the recess 21 in plan view. The portion of the lower end of the wall surface 32 projecting above the recess 21 is ring-shaped.

The recess 21 is in connection with the opening 31 as described above. The recess 21 has, for example, a depth from the upper surface of the wiring layer 20 to an intermediate position in the thickness direction of the wiring layer 20. Thus, the recess 21 has a bottom surface located at the intermediate position of the wiring layer 20 in the thickness direction. The recess 21 does not extend through the wiring layer 20 in the thickness direction.

The upper open end of the recess 21 has a greater opening width than the lower open end of the opening 31. The recess 21 extends, for example, from the lower end of the wall surface 32 into the solder resist layer 30. Thus, the lower surface of the solder resist layer 30 that extends from the lower end of the wall surface 32 is partially exposed in the recess 21. The upper open end of the recess 21 is located further outward from the lower end of the wall surface 32 in plan view. The upper open end of the recess 21 is located, for example, closer to the center of the opening 31 than the upper open end of the opening 31 in plan view.

The recess 21 has a cross section that is, for example, semi-circular or semi-elliptical in shape. The term semi-circular as used in this specification includes not only the shape of a semicircle obtained by bisecting a perfect circle but also, for example, an arc that is longer than or shorter than a semicircle. The term semi-elliptical as used in this specification includes not only the shape of a semi-ellipse obtained by bisecting an ellipse but also, for example, an arc that is longer than or shorter than a semi-ellipse. The surface of the recess 21 is an arcuate curved surface. The surface of the recess 21 is curved downward from the upper open end of the recess 21 toward the center of the recess 21. The recess 21 has a depth of, for example, approximately 2 m to 7 m. The recess 21 is, for example, circular and concentric with the opening 31 in plan view.

Structure of External Plating Layer 40

The external plating layer 40 is formed on the wiring layer 20 that is exposed at the bottom of each opening 31. The external plating layer 40 includes, for example, a plating layer 41, a plating layer 42, and a plating layer 43. The external plating layer 40 is a stack of the plating layer 41, the plating layer 42, and the plating layer 43 formed in this order on the wiring layer 20 that is exposed at the bottom of the opening 31. The plating layers 41, 42, and 43 may be metal layers formed through an electroless plating process, that is, electroless plating layers.

The plating layer 41 is a nickel (Ni) layer formed from Ni or a Ni alloy. The plating layer 41, which is a Ni layer, functions to, for example, limit diffusion of Cu included in the wiring layer 20 to the plating layers 42 and 43. The plating layers 42 and 43 are formed from a metal having a higher resistance to oxidation than the metal (Cu) forming the wiring layer 20. Thus, the plating layers 42 and 43 function to limit oxidation of the wiring layer 20. The plating layers 42 and 43 are formed from a metal having a higher resistance to oxidation than the metal (Ni) forming the plating layer 41. The plating layer 42 is, for example, a palladium (Pd) layer formed from Pd or a Pd alloy. The plating layer 43 is, for example, a gold (Au) layer formed from Au or a Au alloy. The plating layer 42, which is a Pd layer, functions to limit interdiffusion of Au and Ni that would be caused by heat.

The plating layer 41 is formed on the wiring layer 20 that is exposed in the opening 31. The recess 21 is, for example, filled with the plating layer 41 that projects into the opening 31. The plating layer 41 includes, for example, a filling 51 that fills the recess 21 and a post 52 that projects further upward from the filling 51 in the opening 31. For example, the filling 51 and the post 52 are formed continuously and integrally.

The filling 51 covers, for example, the lower surface of the solder resist layer 30 that is exposed in the recess 21. The filling 51 is shaped in correspondence with the recess 21. For example, the filling 51 has a cross section that is semi-circular or semi-elliptical in shape. For example, the filling 51 has a circular shape in plan view.

The post 52 projects, for example, further upward from the upper surface of the wiring layer 20. The post 52 may have any shape and size in plan view. The post 52 is, for example, shaped in correspondence with the opening 31 in plan view. For example, the post 52 has a circular shape in plan view. The post 52 may have a thickness of, for example, 3 m to 10 m. The post 52 is smaller in size than the opening 31 in plan view. For example, the post 52 is slightly smaller in size in plan view than the opening 31 over the entire length of the post 52 in the thickness direction.

In the example of FIG. 2, the post 52 is tapered so that the width (diameter) decreases from the upper side (upper surface of post 52) toward the lower side (upper surface of wiring layer 20). The post 52 has the form of a reversed truncated cone so that its upper surface has a larger diameter than its lower surface. The lower surface of the post 52 has, for example, a smaller diameter than the filling 51. The upper surface of the post 52 has, for example, a smaller diameter than the filling 51. The post 52 includes a side surface 53 inwardly inclined from the upper surface of the post 52 toward the lower surface of the post 52, that is, toward the center of the post 52. The side surface 53 does not have to be straight and may be partially or entirely curved inwardly or outwardly. In the example of FIG. 2, the side surface 53 is an inclined surface extending straight without any stepped parts in cross section. Thus, the side surface 53 is inclined at a constant angle. The side surface 53 is, for example, inclined at an angle equal to that of the wall surface 32 of the opening 31. Alternatively, the side surface 53 may be inclined at an angle differing from that of the wall surface 32 of the opening 31 so that a gap S1 becomes larger toward the upper side. The side surface 53 extends, for example, parallel to the wall surface 32 of the opening 31. The side surface 53 is separated, in plan view, from the wall surface 32 of the opening 31 in a direction orthogonal to the thickness direction of the post 52. The gap S1 extends between the side surface 53 of the post 52 and the wall surface 32 of the opening 31. The gap S1 extends continuously around the entire post 52 in the circumferential direction. The gap S1 extends, for example, over the entire length of the post 52 in the thickness direction. The gap S1 has a width, which is the distance between the side surface 53 of the post 52 and the wall surface 32 of the opening 31, of, for example, approximately 0.5 m to 13 m.

The plating layer 42 entirely covers the surface of the plating layer 41 that is exposed in the opening 31 of the solder resist layer 30. The plating layer 42, for example, entirely covers the upper surface of the post 52 and the side surface 53 of the post 52. The plating layer 42, for example, entirely covers the side surface 53 of the post 52 that is exposed in the gap S1. The plating layer 42, for example, entirely covers the upper surface of the filling 51 that extends sideward from the lower end of the post 52 and is exposed in the gap S1. The plating layer 42, for example, continuously covers the upper surface of the post 52, the side surface 53 of the post 52, and the upper surface of the filling 51. The part of the plating layer 42 covering the upper surface of the post 52 has, for example, a greater thickness than the part of the plating layer 42 covering the side surface 53 of the post 52 and the upper surface of the filling 51. The part of the plating layer 42 covering the post 52 may have a thickness of, for example, approximately 0.02 m to 0.06 m. The part of the plating layer 42 covering the side surface 53 of the post 52 and the upper surface of the filling 51 may have a thickness of, for example, approximately 0.01 m to 0.04 m.

The plating layer 43 entirely covers the surface of the plating layer 42 that is exposed in the opening 31 of the solder resist layer 30. The plating layer 43, for example, entirely covers the upper surface of the plating layer 42, which is the part covering the upper surface of the post 52, and the side surface of the plating layer 42, which is the part covering the side surface 53 of the post 52. The plating layer 43, for example, entirely covers the side surface the plating layer 42 that is exposed in the gap S1. The plating layer 43, for example, entirely covers the part of the upper surface of the plating layer 42 covering the upper surface of the filling 51 in the gap S1. The part of the plating layer 43 covering the plating layer 42 on the post 52 has, for example, a greater thickness than the part of the plating layer 43 in the gap S1. The part of the plating layer 43 covering the plating layer 42 on the post 52 may have a thickness of, for example, approximately 0.03 m to 0.09 m. The part of the plating layer 43 in the gap S1, which is the part of the plating layer 43 covering the side surface of the plating layer 42 and the part of the plating layer 43 covering the plating layer 42 on the upper surface of the filling 51, may have a thickness of, for example, approximately 0.01 m to 0.05 am.

The side surface of the plating layer 43 is, for example, separated from the wall surface 32 of the opening 31 in plan view. Thus, a gap extends between the side surface of the plating layer 43 and the wall surface 32 of the opening 31. The gap extends continuously in the circumferential direction throughout the entire opening 31. The part of the plating layer 43 covering the plating layer 42 on the post 52 is, for example, located downward from the upper surface of the solder resist layer 30. Thus, the external plating layer 40, which is located inside the opening 31, does not project upward from the upper surface of the solder resist layer 30.

Figure 3:
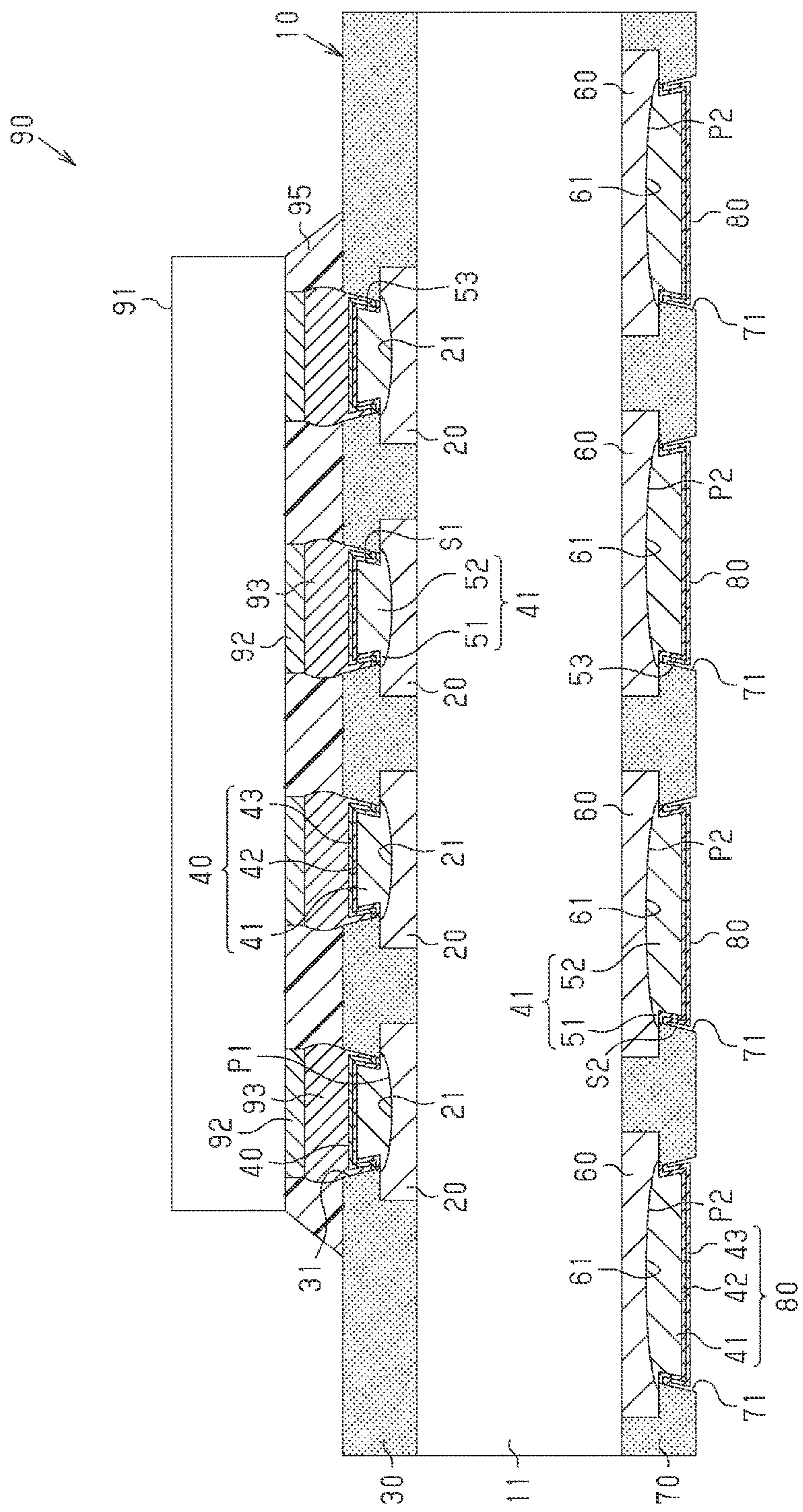
FIG. 3 is a schematic cross-sectional view of a semiconductor device including the wiring substrate of FIG. 1.

As described above, the external plating layer 40 functions as an electronic component mounting connection terminal for electrically connecting an electronic component such as the semiconductor element 91 (refer to FIG. 3).

Structure of Wiring Layer 60

As illustrated in FIG. 1, the wiring layer 60 is formed on the lower surface of the substrate body 11. The wiring layer 60 is the lowermost wiring layer of the wiring substrate 10. The wiring layer 60 may have any shape and size in plan view. For example, the wiring layer 60 has a circular shape in plan view. The wiring layer 60 includes recesses 61 formed in the lower surface of the wiring layer 60. Each recess 61 is inwardly curved toward the substrate body 11. The recess 61 has, for example, the same structure as the recess 21. Thus, the structure of the recess 61 will not be described in detail. For example, the recess 61 has a circular shape in plan view.

Structure of Solder Resist Layer 70

The solder resist layer 70 is formed on the lower surface of the substrate body 11 and covers the wiring layer 60. The solder resist layer 70 is the outermost insulation layer (here, lowermost insulation layer) of the wiring substrate 10. The solder resist layer 70 has a thickness from the lower surface of the wiring layer 60 to the lower surface of the solder resist layer 70 that is, for example, approximately 10 m to 30 m.

The solder resist layer 70 includes openings 71 that extend through the solder resist layer 70 in the thickness direction and expose parts of the lower surface of the wiring layer 60 as external connection pads P2. Each external connection pad P2 functions as, for example, a pad for electrically connecting a mounting board such as a motherboard.

Each opening 71 has, for example, the same structure as the opening 31. Thus, the opening 71 will not be described in detail. The opening 71 is, for example, in connection with the corresponding recess 61 of the wiring layer 60. In the opening 71, for example, the surface of the recess 61 is exposed. For example, the opening 71 has a circular shape in plan view. The opening 71 is tapered so that the opening width (opening diameter) decreases from the lower side as viewed in FIG. 1 (lower surface of solder resist layer 70) toward the upper side (wiring layer 60).

Structure of External Plating Layer 80

The external plating layer 80 is formed on the wiring layer 60 that is exposed at the bottom of each opening 71. The external plating layer 80 has, for example, the same structure as the external plating layer 40. Thus, the structure of the external plating layer 80 will not be described in detail. The external plating layer 80 is a stack of the plating layer 41, the plating layer 42, and the plating layer 43 formed in this order on the wiring layer 60 that is exposed at the bottom of the opening 71. The plating layer 41 of the external plating layer 80 includes, for example, the filling 51 that fills the recess 61 and the post 52 that projects further downward from the filling 51 in the opening 71. A gap S2 extends between the side surface 53 of the post 52 of the external plating layer 80 and the wall surface of the opening 71. The gap S2 extends continuously around the entire post 52 in the circumferential direction. The plating layer 42 of the external plating layer 80 entirely covers, for example, the surface of the plating layer 41 of the external plating layer 80 that is exposed in the opening 71 of the solder resist layer 70. The plating layer 42 of the external plating layer 80 entirely covers, for example, the side surface 53 of the post 52 of the external plating layer 80 that is exposed in the gap S2 and the upper surface of the filling 51 of the external plating layer 80 that is exposed in the gap S2. The plating layer 43 of the external plating layer 80 entirely covers the surface of the plating layer 42 of the external plating layer 80 that is exposed in the gap S2.

The external plating layer 80 functions as an external connection terminal used to mount the wiring substrate 10 on a mounting board such as a motherboard. In the wiring substrate 10 of the example illustrated in FIG. 2, the external plating layer 80 functions as the external connection terminal.

The wiring substrate 10 may be reversed upside down for use and be arranged at any angle.

Structure of Semiconductor Device 90

With reference to FIG. 3, the structure of a semiconductor device 90 will now be described.

The semiconductor device 90 includes the wiring substrate 10, one or more (one in this case) semiconductor elements 91, and an underfill resin 95.

Structure of Semiconductor Element 91

The semiconductor element 91 includes, for example, connection terminals 92 formed on a circuit formation surface of the semiconductor element 91. The semiconductor element 91 is flip-chip-mounted on the wiring substrate 10. The connection terminals 92 of the semiconductor element 91 are electrically connected to the external plating layer 40 of the wiring substrate 10. The connection terminals 92 of the semiconductor element 91 are electrically connected by a solder layer 93 to the external plating layer 40 and the wiring layer 20. Thus, the semiconductor element 91 is electrically connected by the connection terminals 92, the solder layer 93, and the external plating layer 40 to the wiring layer 20. The solder layer 93 bonds the external plating layer 40 to the connection terminals 92. The solder layer 93, for example, fills each opening 31.

The semiconductor element 91 may be, for example, a logic chip such as a central processing unit (CPU) chip or a graphics processing unit (GPU) chip. Further, the semiconductor element 91 may be, for example, a memory chip such as a dynamic random access memory (DRAM) chip, a static random access memory (SRAM), or a flash memory chip. Semiconductor elements 91 including combinations of logic chips and memory chips may be mounted on the wiring substrate 10.

Structure of Connection Terminal 92

The connection terminals 92 may be, for example, metal posts. The connection terminals 92 are, for example, post-shaped connection terminals extending downward from the circuit formation surface of the semiconductor element 91. The connection terminals 92 are, for example, cylindrical posts. The material of the connection terminals 92 may be, for example, copper or a copper alloy. In addition to metal posts, metal bumps (e.g., gold bumps) may be used as the connection terminals 92.

Structure of Solder Layer 93

The solder layer 93 may be, for example, solder plating of lead-free solder. The material of the solder plating may be, for example, Sn—Ag, Sn—Cu, Sn—Ag—Cu, or Sn—Bi lead-free solder.

Structure of Underfill Resin 95

The underfill resin 95 fills the gap between the wiring substrate 10 and the semiconductor element 91. The material of the underfill resin 95 may be, for example, an insulative resin such as an epoxy resin.

In the embodiment illustrated in the present disclosure, the plating layer 41 is one example of a first plating layer, the plating layer 42 is one example of a second plating layer, and the plating layer 43 is one example of a third plating layer.

Method for Manufacturing Wiring Substrate 10

A method for manufacturing the wiring substrate 10 will now be described with reference to FIGS. 4A to 6B. Here, a method for forming the external plating layer 40 on the wiring substrate 10 will be described. To simplify illustration, elements that will consequently become final elements of the wiring substrate 10 are given the same reference characters as the final elements.

Figure 4A:
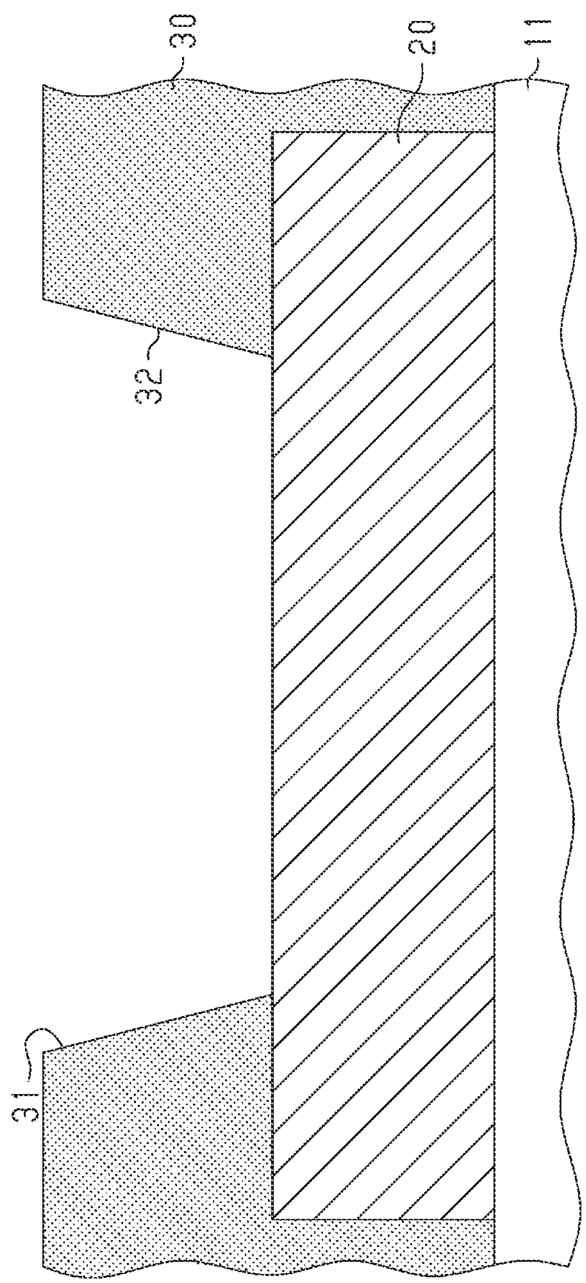
FIGS. 4A, 4B, 5A, 5B, 6A, and 6B are schematic cross-sectional views illustrating a method for manufacturing the wiring substrate of FIG. 1.

As illustrated in FIG. 4A, a structure in which the wiring layer 20 and the solder resist layer 30 are formed on the upper surface of the substrate body 11 is first prepared. The solder resist layer 30 includes the openings 31 exposing parts of the upper surface of the wiring layer 20. A known process may be performed to form this structure. Thus, the process will not be described in detail.

Figure 4B:
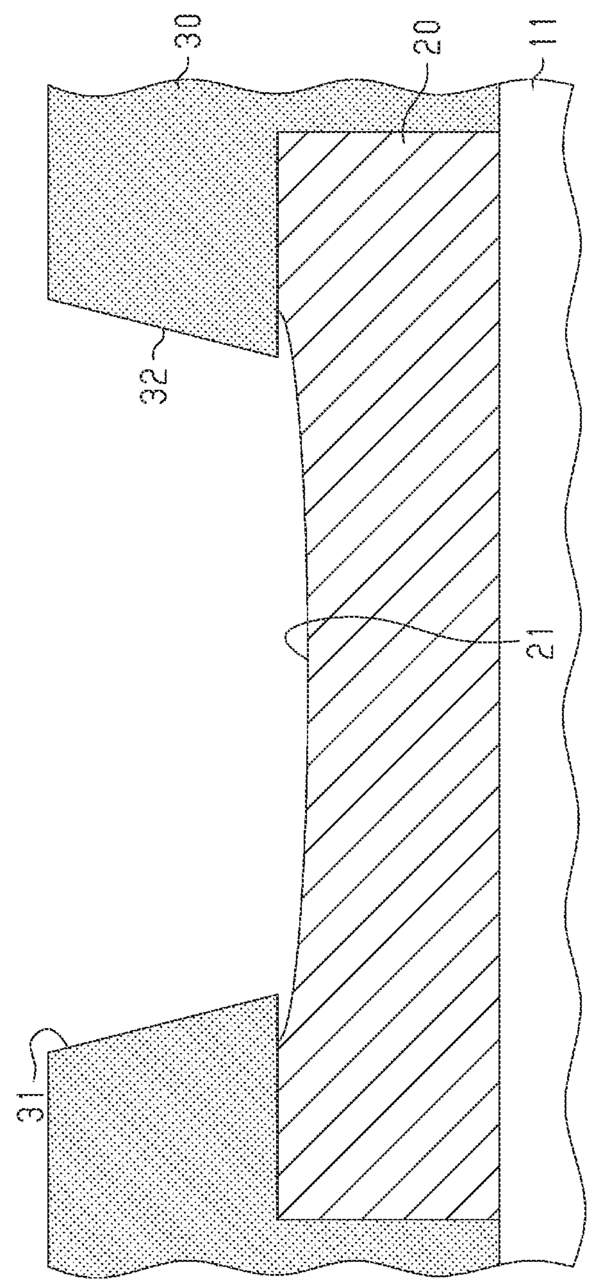

In the step illustrated in FIG. 4B, in each opening 31 of the solder resist layer 30, the recess 21, which is in connection with the opening 31, is formed in the upper surface of the wiring layer 20 that is exposed in the opening 31. For example, wet etching is performed on the wiring layer 20 using the solder resist layer 30 as an etching mask to form the recess 21. Wet etching of the wiring layer 20 produces a side etch effect in which the wiring layer 20 is etched in the planar direction. The side etch effect extends the recess 21 of the wiring layer 20 outward from the bottom of the opening 31 (i.e., lower end of wall surface 32). Consequently, the recess 21, which has a greater opening width than the lower end of the opening 31, is formed in the upper surface of the wiring layer 20. The recess 21, which extends from the lower end of the wall surface 32, partially exposes the lower surface of the solder resist layer 30.

Figure 5A:
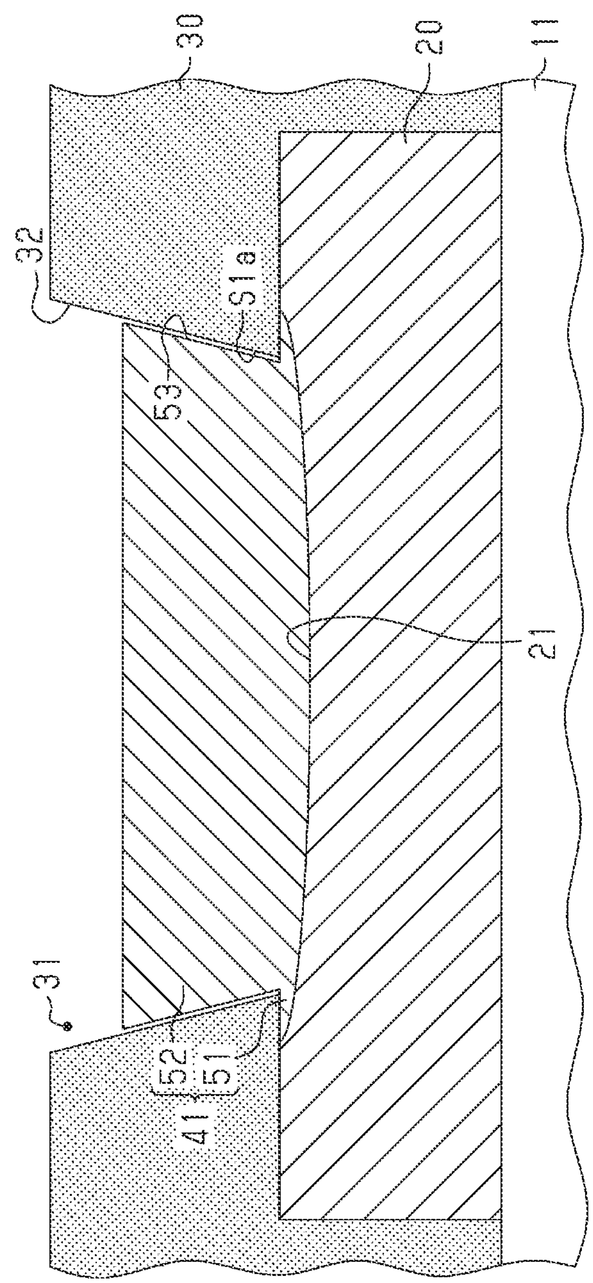

In the step illustrated in FIG. 5A, the plating layer 41 of nickel or a nickel alloy is formed on the upper surface of the wiring layer 20 that is exposed in the opening 31. The plating layer 41 may be formed through an electroless plating process, in this case, an electroless Ni plating process. The plating layer 41 projects further upward from the upper surface of the wiring layer 20 inside the opening 31. For example, the plating layer 41 fills the recess 21 and projects into the opening 31. Thus, the plating layer 41 includes the filling 51, which fills the recess 21, and the post 52, which projects upward from the upper surface of the filling 51. The post 52 of the plating layer 41 is formed, for example, in the lower portion of the opening 31. The plating layer 41 does not contact the solder resist layer 30. Thus, a small gap Sla is produced between the side surface 53 of the post 52 and the wall surface 32 of the opening 31 in the solder resist layer 30. The gap Sla is smaller than the gap S1 illustrated in FIG. 2. The gap Sla may have a width of, for example, several nanometers to approximately 300 nm.

Figure 5B:
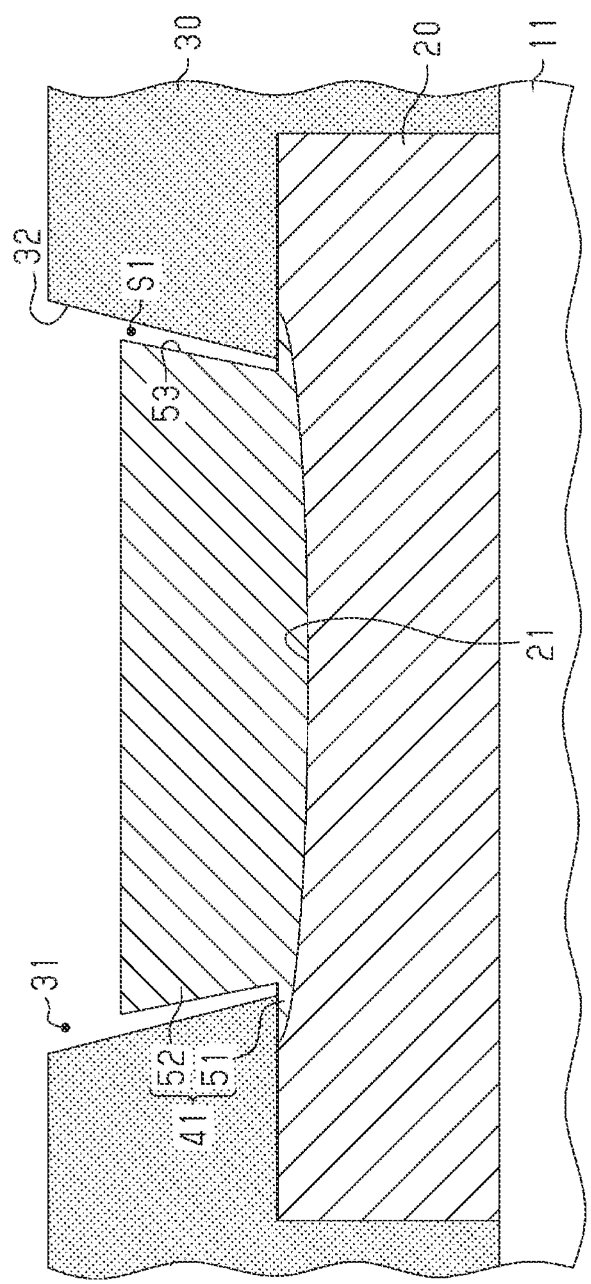

Then, in the step illustrated in FIG. 5B, the plating layer 41 is partially etched to form the gap S1 between the side surface 53 of the plating layer 41 and the wall surface 32 of the opening 31. For example, part of the plating layer 41 is selectively etched and removed to enlarge the gap Sla from the solder resist layer 30 and the wiring layer 20 illustrated in FIG. 5A and form the gap S1. In the example of FIG. 5A, part of the upper surface of the post 52 and part of the side surface 53 of the post 52 is etched and removed so that the post 52 is reduced in thickness or size. The gap S1 is formed by cutting into the side surface 53 of the post 52 and widening the space between the side surface 53 of the post 52 and the wall surface 32 of the opening 31. The gap S1 has a width of, for example, approximately 0.5 m to 13 m. The etching solution used in this step may be, for example, a hydrogen peroxide or nitric acid solution.

Figure 6A:
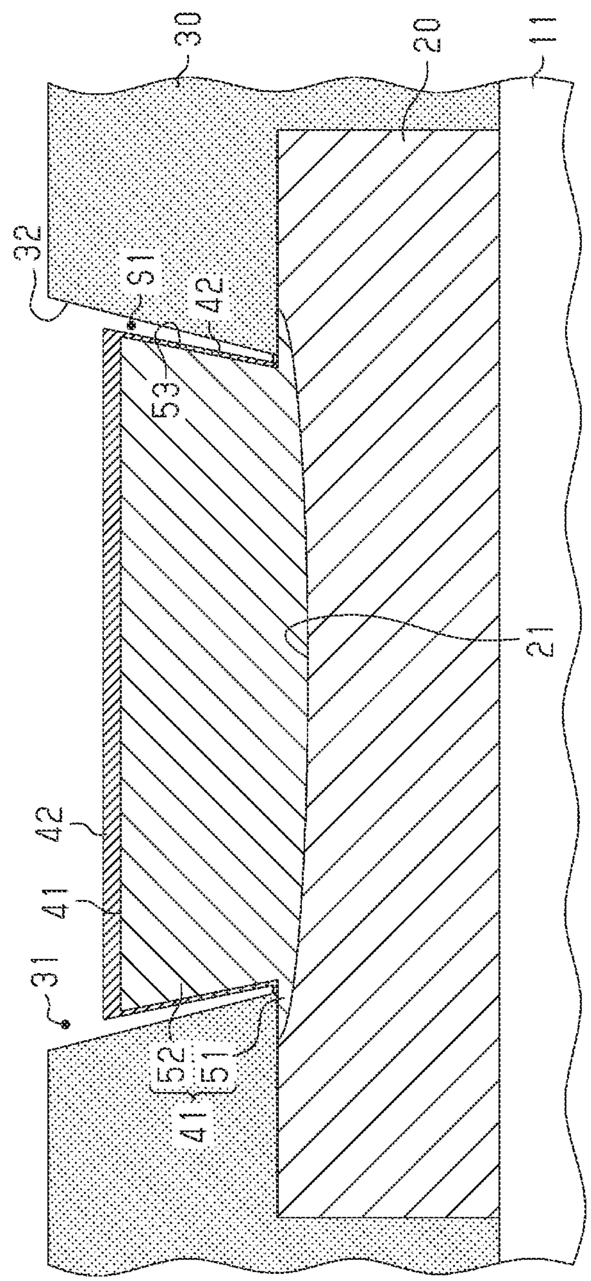

In the step illustrated in FIG. 6A, the plating layer 42 is formed entirely covering the surface of the plating layer 41 that is exposed in the opening 31 of the solder resist layer 30. The plating layer 42 may be formed through an electroless plating process, in this case, an electroless Pd plating process. The plating layer 42 entirely covers the upper surface of the post 52. The plating layer 42 entirely covers the side surface 53 of the post 52 that is exposed in the gap S1. The plating layer 42 entirely covers the upper surface of the filling 51 that is exposed in the gap S1 and extends sideward from the lower end of the post 52. The gap S1 that is larger than the gap Sla is formed between the side surface 53 of the post 52 and the wall surface 32 of the opening 31. Thus, the plating solution smoothly enters the gap S1. This forms the plating layer 42 entirely covering the side surface 53 of the post 52 that is exposed in the gap S1 and the upper surface of the filling 51 that is exposed in the gap S1. That is, the plating layer 42 is formed entirely covering the surface of the plating layer 41 exposed in the opening 31 of the solder resist layer 30.

Figure 6B:
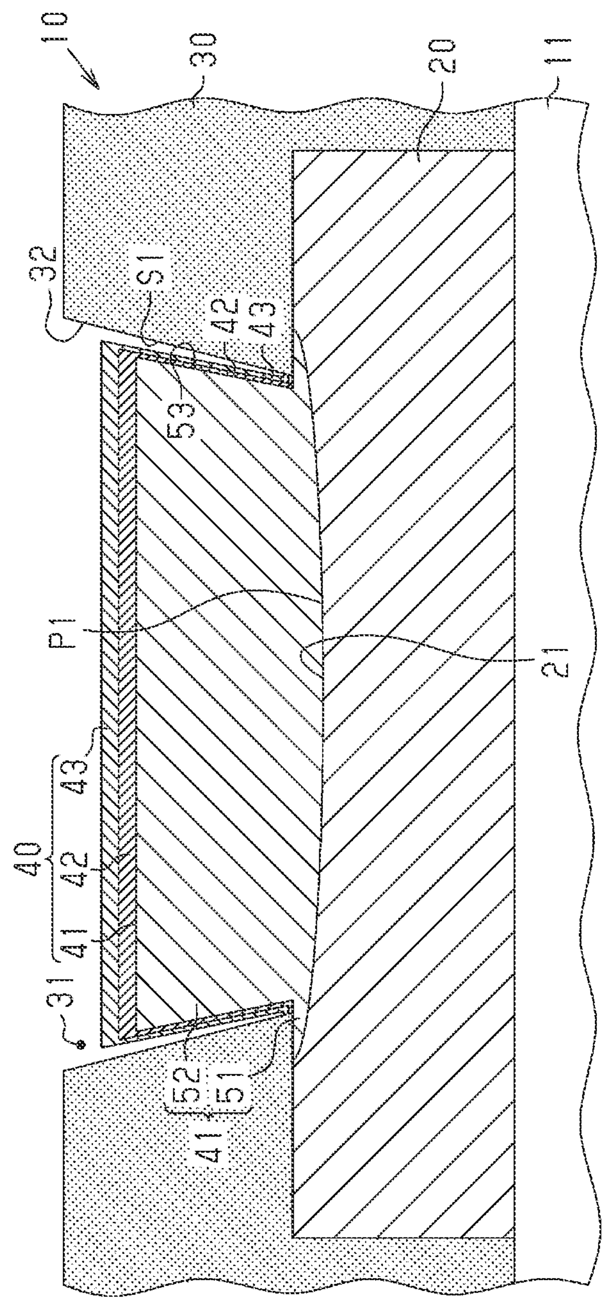

In the step illustrated in FIG. 6B, the plating layer 43 is formed entirely covering the surface of the plating layer 42 that is exposed in the opening 31 of the solder resist layer 30. The plating layer 43 may be formed through an electroless plating process, in this case, an electroless Au plating process. The plating layer 43 entirely covers the upper surface of the plating layer 42, formed on the upper surface of the post 52, and the side surface of the plating layer 42 that is exposed in the gap S1. Further, the plating layer 43 entirely covers the upper surface of the plating layer 42 that is formed on the upper surface of the filling 51 in the gap S1.

The external plating layer 40 illustrated in FIG. 2 is formed through the steps described above. The external plating layer 80 illustrated in FIG. 1 may be formed in the same manner. Thus, the process for forming the external plating layer 80 will not be described.

The illustrated embodiment has the advantages described below.

(1) The gap S1 extends between the side surface 53 of the plating layer 41 and the wall surface 32 of the opening 31 in the solder resist layer 30. The plating layers 42 and 43 entirely cover the side surface 53 of the plating layer 41 that is exposed in the gap S1. With this structure, the plating layers 42 and 43 entirely cover the side surface 53 of the plating layer 41 that is exposed in the gap S1. Thus, even if cleaning water enters the gap S1, Ni will not be eluted from the plating layer 41 into the cleaning water. This reduces Ni that collects on the surface of the plating layer 43 and avoids discoloring of the plating layer 43. As a result, the quality of the wiring substrate 10 will be unaffected.

(2) The plating layer 43 covers the surface of the plating layer 42 that is formed from Pd or a Pd alloy. The plating layer 43 is formed from Au or a Au alloy. The plating layer 42, which is a Pd layer having an effective barrier property, is located between the plating layer 41, which is a Ni layer, and the plating layer 43, which is an Au layer. This limits interdiffusion of Au and Ni that would be caused by heat.

(3) The upper surface of the wiring layer 20 includes the recesses 21 that are in connection with the corresponding openings 31. Each recess 21 is filled with the plating layer 41 that is formed on the upper surface of the wiring layer 20. The recess 21 exposes part of the lower surface of the solder resist layer 30 that extends from the lower end of the wall surface 32 of the opening 31. With this structure, the plating layer 41 partially overlaps the solder resist layer 30 in plan view. This restricts separation of the plating layer 41 from the solder resist layer 30.

(4) The plating layer 42 entirely covers the upper surface of the post 52 of the plating layer 41, the side surface 53 of the post 52, and the upper surface of the filling 51 that extends sideward from the lower end of the post 52 and is exposed in the gap S1. With this structure, the plating layer 42 entirely covers the surface of the plating layer 41 that is exposed to the outside from the solder resist layer 30. Thus, even if cleaning water enters the gap S1, Ni will not be eluted from the plating layer 41 into the cleaning water.

OTHER EMBODIMENTS

It should be apparent to those skilled in the art that the foregoing embodiments may be implemented in many other specific forms without departing from the scope of this disclosure. Particularly, it should be understood that the foregoing embodiments may be implemented in the following forms.

The above-described embodiment may be modified as described below. The above embodiment and the modified examples described below may be combined as long as there is no technical contradiction.

In the external plating layer 40 of the above embodiment, a gap extends between the side surface of the plating layer 43 and the wall surface 32 of the opening 31 in the solder resist layer 30. The gap, however, may be omitted.

Figure 7:
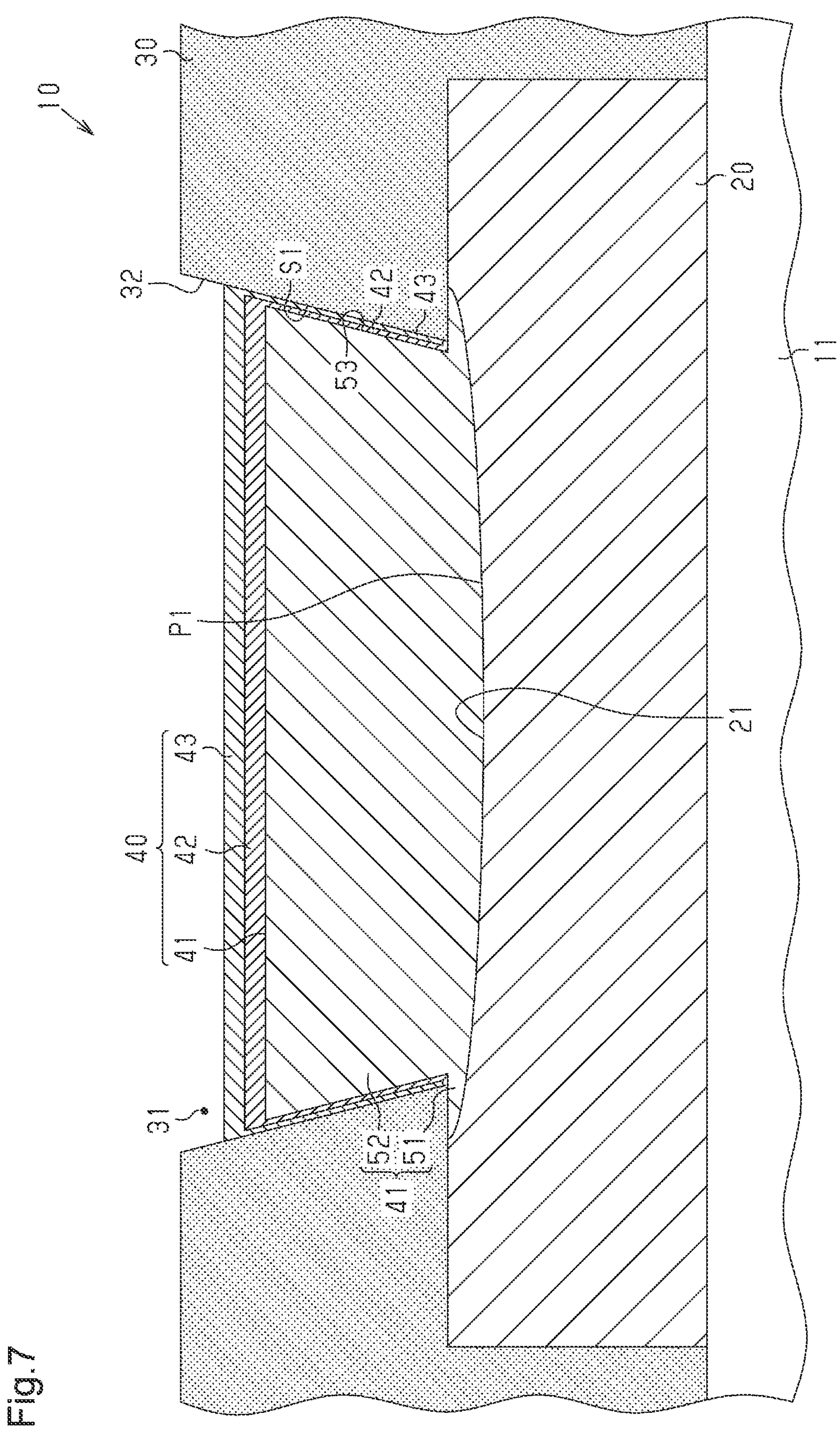
FIGS. 7, 8, and 9 are partially enlarged cross-sectional views illustrating modified examples of the wiring substrate.

For example, as illustrated in FIG. 7, there may be no gap between the side surface of the plating layer 43 and the wall surface 32 of the opening 31. In this case, the side surface of the plating layer 43 contacts the wall surface 32 of the opening 31. The external plating layer 80 may be modified in the same manner.

Figure 8:
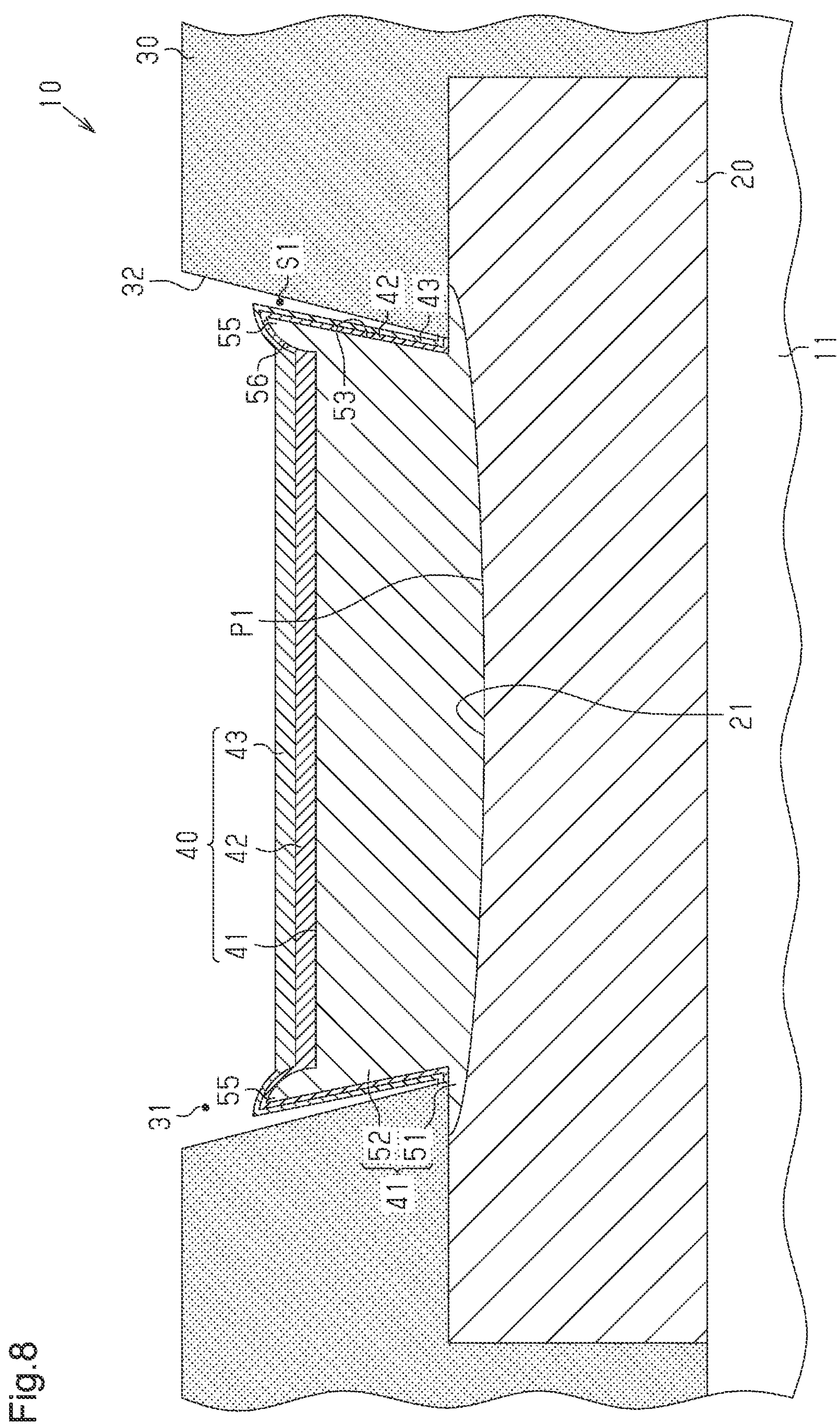

As illustrated in the example of FIG. 8, the plating layer 41 may include a projection 55 on a periphery of the upper surface of the plating layer 41. The projection 55 is arranged on, for example, the periphery of the upper surface of the post 52. The projection 55, for example, projects further upward from other parts of the upper surface of the post 52. The projection 55, for example, is formed continuously over the entire post 52 in the circumferential direction. The projection 55, for example, is projected by an amount that increases from a central side of the upper surface of the post 52 toward an outer edge of the upper surface of the post 52. The projection 55 includes, for example, an arcuate curved surface 56. The curved surface 56 is upwardly bulged from the central side of the upper surface of the post 52 toward the outer edge of the upper surface of the post 52. In this case, the plating layer 42 entirely covers the upper surface of the post 52 including the curved surface 56, the side surface 53 of the post 52, and the upper surface of the filling 51 that extends sideward from the lower end of the post 52 and is exposed in the gap S1. The plating layer 43 entirely covers the surface of the plating layer 42. The external plating layer 80 may be modified in the same manner.

Figure 9:
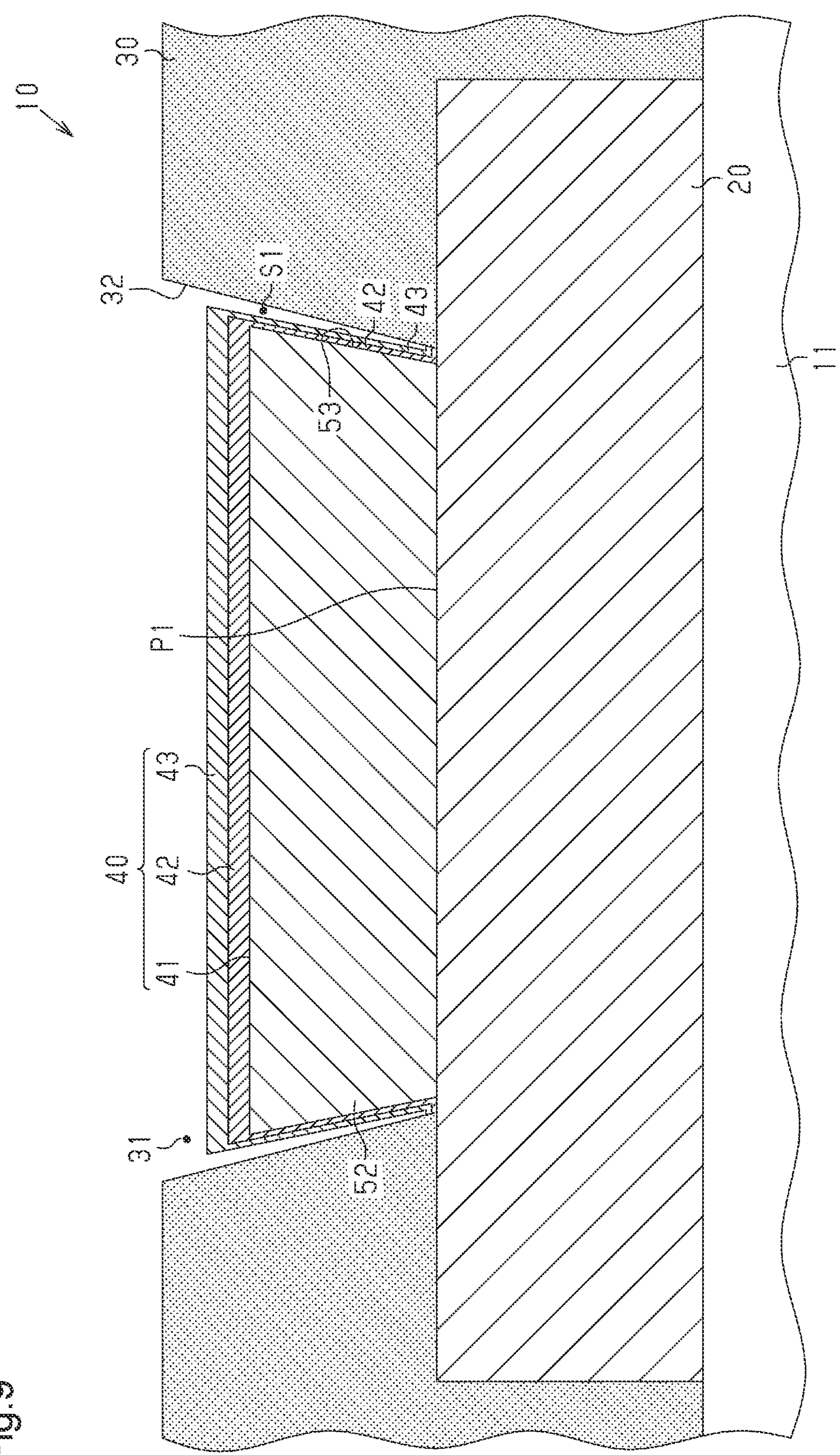

As illustrated in the example of FIG. 9, the recess 21 may be omitted from the upper surface of the wiring layer 20. In this case, the plating layer 41 includes, for example, only the post 52 that projects upward from the upper surface of the wiring layer 20 and is exposed in the opening 31. The post 52 has, for example, the same structure as the post 52 illustrated in FIG. 2. The post 52, for example, partially exposes the upper surface of the wiring layer 20 in the opening 31. In other words, the upper surface of the wiring layer 20 is partially exposed at the bottom of the gap S1 between the side surface 53 of the post 52 and the wall surface 32 of the opening 31. In this case, the plating layer 42 entirely covers the upper surface of the post 52, the side surface 53 of the post 52, and the upper surface of the wiring layer 20 that extends sideward from the lower end of the post 52 and is exposed in the gap S1. Further, the plating layer 43 entirely covers the surface of the plating layer 42.

With this structure, the plating layer 42 entirely covers the surface of the plating layer 41 that is exposed in the opening 31 and the upper surface of the wiring layer 20 that is exposed in the opening 31. Thus, even if cleaning water enters the gap S1, Ni from the plating layer 41 or Cu from the wiring layer 20 will not be eluted into the cleaning water.

In the same manner, the lower surface of the wiring layer 60 may have no recess 61. In this case, the external plating layer 80 may have the same structure as the external plating layer 40 illustrated in FIG. 9.

In the above embodiment, the external plating layer 40 is a stack of the plating layer 41 that is a Ni layer, the plating layer 42 that is a Pd layer, and the plating layer 43 that is a Au layer formed in order on the upper surface of the wiring layer 20. Instead, the external plating layer 40 may be, for example, a stack of a Ni layer and a Au layer formed in order on the upper surface of the wiring layer 20. Alternatively, the external plating layer 40 may be a stack of a Ni layer, a Pd layer, and a silver (Ag) layer formed in order on the upper surface of the wiring layer 20. As another option, the external plating layer 40 may be a stack of a Ni layer, a Pd layer, a Ag layer, and a Au layer formed in order on the upper surface of the wiring layer 20. The external plating layer 80 may be modified in the same manner.

In the above embodiment, the part of the plating layer 42 covering the upper surface of the post 52 may have a thickness equal to that of the part of the plating layer 42 covering the side surface 53 of the post 52.

In the above embodiment, the part of the plating layer 43 covering the upper surface of the plating layer 42, which is formed on the upper surface of the post 52, may have a thickness equal to that of the part of the plating layer 43 covering the side surface of the plating layer 42, which is formed on the side surface 53 of the post 52.

In the above embodiment, the wall surface 32 of the opening 31 in the solder resist layer 30 may extend orthogonal to the upper surface of the solder resist layer 30 in cross section. In this case, the side surface 53 of the post 52 may extend orthogonal to the upper surface of the solder resist layer 30 in cross section. In the same manner, the wall surface of the opening 71 in the solder resist layer 70 may extend orthogonal to the lower surface of the solder resist layer 70.

In the above embodiment, one of the external plating layers 40 and 80 may be omitted from the wiring substrate 10.

In the above embodiment, the solder resist layers 30 and 70, exemplified as protective insulation layers that are the outermost insulation layers of the wiring substrate 10, may be protective insulation layers formed from any type of insulative resin that is photosensitive.

In the above embodiment, the underfill resin 95 may be omitted from the semiconductor device 90.

In the semiconductor device 90 of the above embodiment, the external plating layer 80 is an external connection terminal. Instead, for example, an external connection terminal such as a solder ball or a lead pin may be formed on the external plating layer 80.

Instead of the semiconductor element 91, an electric component other than the semiconductor element 91, for example, a chip component such as a chip capacitor, a chip resistor, or a chip inductor, or a crystal oscillator may be mounted on the wiring substrate 10 of the present embodiment.

The wiring substrate 10 of the above embodiment may be embodied in a wiring substrate for any type of package such as a chip size package (CSP) or a small outline non-lead package (SON).

CLAUSES

1. A method for manufacturing a wiring substrate, the method including:
   - forming a protective insulation layer that covers a wiring layer and incudes an opening partially exposing an upper surface of the wiring layer;
   - forming a first plating layer from a metal of nickel or a nickel alloy on the wiring layer exposed in the opening by performing an electroless plating process;
   - forming a gap between a side surface of the first plating layer and a wall surface of the opening by etching part of the first plating layer; and
   - forming a second plating layer entirely covering a surface of the first plating layer that is exposed in the opening of the protective insulation layer by performing an electroless plating process, where:
   - the second plating layer is formed from a metal having a higher resistance to oxidation than the metal forming the first plating layer; and the second plating layer entirely covers a side surface of the first plating layer that is exposed in the gap.

2. The method according to clause 1, further including:

forming a third plating layer entirely covering a surface of the second plating layer that is exposed in the opening of the protective insulation layer by performing an electroless plating process, where:

the second plating layer is formed from palladium or a palladium alloy;

the third plating layer is formed from gold or a gold alloy; and the third plating layer entirely covers a side surface of the second plating layer that is exposed in the gap.

3. The method according to clause 1 or 2, further including:

forming a recess in an upper surface of the wiring layer that is exposed in the opening before forming the first plating layer, where the recess is filled with the first plating layer that projects into the opening.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A wiring substrate, comprising:

a wiring layer;

a protective insulation layer covering the wiring layer;

an opening extending through the protective insulation layer in a thickness direction and partially exposing an upper surface of the wiring layer;

a first plating layer located inside the opening and formed on the wiring layer that is exposed in the opening;

a gap extending between a side surface of the first plating layer and a wall surface of the opening; and a second plating layer entirely covering a surface of the first plating layer that is exposed in the opening of the protective insulation layer, wherein:

the first plating layer is formed from a metal of nickel or a nickel alloy;

the second plating layer is formed from a metal having a higher resistance to oxidation than the metal forming the first plating layer;

the wiring layer includes a recess that is in connection with the opening and formed in the upper surface of the wiring layer;

the recess exposes part of a lower surface of the protective insulation layer that extends from a lower end of the wall surface of the opening;

the recess is filled with the first plating layer;

the first plating layer includes a filling that fills the recess and a post that projects upward from an upper surface of the filling;

the second plating layer covers an entirety of an upper surface of the post, an entirety of a side surface of the post, and an entirety of the upper surface of the filling that extends sideward from a lower end of the side surface of the first plating layer to a post to the lower end of the wall surface of the opening and is exposed in the gap; and the second plating layer is spaced apart from the wall surface of the opening by the gap while being in contact with the lower end of the wall surface of the opening.

2. The wiring substrate according to claim 1, further comprising a third plating layer entirely covering a surface of the second plating layer that is exposed in the opening of the protective insulation layer, wherein:

the second plating layer is formed from palladium or a palladium alloy; and the third plating layer is formed from gold or a gold alloy.

3. The wiring substrate according to claim 1, wherein:

the first plating layer includes a projection on a periphery of an upper surface of the first plating layer; and the projection projects further upward from other parts of the upper surface of the first plating layer.

4. The wiring substrate according to claim 2, wherein the third plating layer entirely covers a side surface of the second plating layer that is exposed in the gap.

5. The wiring substrate according to claim 2, wherein the third plating layer is spaced apart from the wall surface of the opening.

6. The wiring substrate according to claim 3, wherein the projection is projected by an amount that increases from a central side of the upper surface of the first plating layer toward an outer edge of the upper surface of the first plating layer.

* * * * *